(12) United States Patent
Strautmann et al.

(10) Patent No.: US 10,106,888 B2
(45) Date of Patent: Oct. 23, 2018

(54) PROCESS FOR THE GENERATION OF THIN INORGANIC FILMS

(71) Applicant: BASF SE, Ludwigshafen (DE)

(72) Inventors: Julia Strautmann, Bad Laer (DE); Rocco Paciello, Bad Duerkheim (DE); Thomas Schaub, Neustadt (DE); Kerstin Schierle-Arndt, Zwingenberg (DE); Daniel Loeffler, Birkenheide (DE); Hagen Wilmer, Ludwigshafen (DE); Felix Eickemeyer, Heidelberg (DE); Florian Blasberg, Frankfurt (DE); Carolin Limburg, Mannheim (DE)

(73) Assignee: BASF SE, Ludwigshafen (DE)

( * ) Notice: Subject to any disclaimer, the term of this patent is extended or adjusted under 35 U.S.C. 154(b) by 0 days.

(21) Appl. No.: 15/501,631

(22) PCT Filed: Jul. 24, 2015

(86) PCT No.: PCT/EP2015/066981
§ 371 (c)(1),
(2) Date: Feb. 3, 2017

(87) PCT Pub. No.: WO2016/020208
PCT Pub. Date: Feb. 11, 2016

(65) Prior Publication Data
US 2017/0233865 A1    Aug. 17, 2017

(30) Foreign Application Priority Data

Aug. 4, 2014  (EP) ..................................... 14179724

(51) Int. Cl.
C23C 16/06      (2006.01)
C23C 16/18      (2006.01)
C23C 16/455     (2006.01)

(52) U.S. Cl.
CPC ........ *C23C 16/18* (2013.01); *C23C 16/45553* (2013.01)

(58) Field of Classification Search
CPC .......... C23C 16/06; C23C 16/18; C23C 16/22
See application file for complete search history.

(56) References Cited

U.S. PATENT DOCUMENTS

| | | | | |
|---|---|---|---|---|
| 5,037,997 A * | 8/1991 | Zhukov | ..................... | C07C 2/30 502/115 |
| 9,434,666 B2 * | 9/2016 | Vasudevan | ............ | C07C 29/172 |
| 2003/0201161 A1 * | 10/2003 | Nocera | ................ | B01J 31/1855 204/157.52 |
| 2009/0226612 A1 | 9/2009 | Ogawa et al. | | |
| 2012/0108062 A1 | 5/2012 | Anthis et al. | | |
| 2013/0236657 A1 * | 9/2013 | Anthis | ..................... | C23C 16/04 427/535 |
| 2013/0309417 A1 * | 11/2013 | Matero | ................... | C23C 16/40 427/576 |
| 2013/0320344 A1 | 12/2013 | Kim et al. | | |
| 2014/0102365 A1 | 4/2014 | Anthis et al. | | |
| 2015/0073182 A1 * | 3/2015 | Nicholas | ................... | C07C 2/36 585/251 |

FOREIGN PATENT DOCUMENTS

| | | | |
|---|---|---|---|
| JP | 2012-156491 | * | 8/2012 |
| WO | WO 2008/141439 A1 | | 11/2008 |
| WO | WO 2012/057884 A1 | | 5/2012 |

OTHER PUBLICATIONS

International Search Report dated Oct. 23, 2015 in PCT/EP2015/066981 filed Jul. 24, 2015.
Extended European Search Report dated Nov. 18, 2014 in Patent Application No. 14179724.1.
International Search Report and Written Opinion dated Oct. 23, 2015 in PCT/EP2015/066981.
International Preliminary Report on Patentability and Written Opinion dated Feb. 16, 2017 in PCT/EP2015/066981.
Steven M. George, "Atomic Layer Deposition: An Overview", Chemical Reviews, vol. 110, Issue 1, 2010, pp. 111-131.
U.S. Appl. No. 15/114,666, filed Jul. 27, 2016, US 2016-0348243 A1, Ke Xu, et al.
U.S. Appl. No. 15/325,840, filed Jan. 12, 2017, Julia Strautmann, et al.

* cited by examiner

*Primary Examiner* — Bret P Chen
(74) *Attorney, Agent, or Firm* — Oblon, McClelland, Maier & Neustadt, L.L.P.

(57) ABSTRACT

A process of bringing a compound of general formula (I) into the gaseous or aerosol state $$L_n\text{--}M\text{---}X_m \quad (I)$$

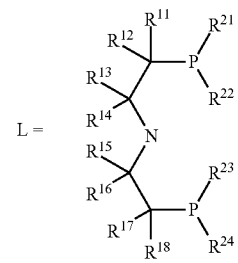

and depositing the compound of general formula (I) from the gaseous or aerosol state onto a solid substrate, wherein $R^{11}$, $R^{12}$, $R^{13}$, $R^{14}$, $R^{15}$, $R^{16}$, $R^{17}$, $R^{18}$ are independent of each other hydrogen, an alkyl group, an aryl group, or a trialkylsilyl group, $R^{21}$, $R^{22}$, $R^{23}$, $R^{24}$ are independent of each other an alkyl group, an aryl group, or a trialkylsilyl group, n is 1 or 2, M is a metal or semimetal, X is a ligand which coordinates M, and m is an integer from 0 to 3.

12 Claims, 10 Drawing Sheets

PROCESS FOR THE GENERATION OF THIN INORGANIC FILMS

The present invention is in the field of processes for the generation of thin inorganic films on substrates, in particular atomic layer deposition processes.

With the ongoing miniaturization, e.g. in the semiconductor industry, the need for thin inorganic films on substrates increases while the requirements of the quality of such films become stricter. Thin inorganic films serve different purposes such as barrier layer, dielectric, separator of fine structures or as electric contact. Several methods for the generation of thin inorganic films are known. One of them is the deposition of film forming compounds from the gaseous state on a substrate. In order to bring metal or semimetal atoms into the gaseous state at moderate temperatures, it is necessary to provide volatile precursors, e.g. by complexation the metals or semimetals with suitable ligands. These ligands need to be removed after deposition of the complexed metals or semimetals onto the substrate.

WO 2012/057 884 A1 discloses nitrogen-containing ligands for transition metals and their use in atomic layer deposition methods.

WO 2008/141 439 A1 discloses transition metal complexes with phosphor-containing ligands and their use as catalyst in hydrogen generation.

It was an object of the present invention to provide a process for the generation of inorganic films of high quality and reproducibility on solid substrates under economically feasible conditions. It was desired that this process can be performed with as little decomposition of the precursor comprising the metal as possible before it is in contact with the solid substrate. At the same time it was desired to provide a process in which the precursor is easily decomposed after deposited on a solid substrate. It was also aimed at providing a process using metal precursors which can easily be modified and still remain stable in order to fit the precursor's properties to the particular needs.

These objects were achieved by a process comprising bringing a compound of general formula (I) into the gaseous or aerosol state $$L_n\text{---}M\text{---}X_m \quad (I)$$

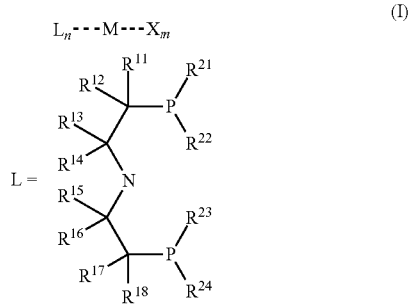

and depositing the compound of general formula (I) from the gaseous or aerosol state onto a solid substrate, wherein
$R^{11}$, $R^{12}$, $R^{13}$, $R^{14}$, $R^{15}$, $R^{16}$, $R^{17}$, $R^{18}$ are independent of each other hydrogen, an alkyl group, an aryl group, or a trialkylsilyl group,
$R^{21}$, $R^{22}$, $R^{23}$, $R^{24}$ are independent of each other an alkyl group, an aryl group, or a trialkylsilyl group,
n is 1 or 2,
M is a metal or semimetal,
X is a ligand which coordinates M, and
m is an integer from 0 to 3.

The present invention further relates to the use of a compound of general formula (I), wherein
$R^{11}$, $R^{12}$, $R^{13}$, $R^{14}$, $R^{15}$, $R^{16}$, $R^{17}$, $R^{18}$ are independent of each other hydrogen, an alkyl group, an aryl group, or a trialkylsilyl group,
$R^{21}$, $R^{22}$, $R^{23}$, $R^{24}$ are independent of each other an alkyl group, an aryl group, or a trialkylsilyl group,
n is 1 or 2,
M is a metal or semimetal,
X is a ligand which coordinates M, and
m is an integer from 0 to 3
for a film formation process on a solid substrate.

Preferred embodiments of the present invention can be found in the description and the claims. Combinations of different embodiments fall within the scope of the present invention.

In the process according to the present invention a compound of general formula (I) is brought into the gaseous or aerosol state. The ligand L is often bound to the metal M via both phosphor atoms and the nitrogen atom, thus ligand L often occupies three coordination sites of metal M, i.e. ligand L is often a tridentate ligand. The nitrogen atom can bear a hydrogen atom or it can be deprotonated.

$R^{11}$, $R^{12}$, $R^{13}$, $R^{14}$, $R^{15}$, $R^{16}$, $R^{17}$, $R^{18}$ are independent of each other hydrogen, an alkyl group, an aryl group, or a trialkylsilyl group. $R^{21}$, $R^{22}$, $R^{23}$, $R^{24}$ are independent of each other an alkyl group, an aryl group, or a trialkylsilyl group, An alkyl group can be linear or branched. Examples for a linear alkyl group are methyl, ethyl, n-propyl, n-butyl, n-pentyl, n-hexyl, n-heptyl, n-octyl, n-nonyl, n-decyl. Examples for a branched alkyl group are iso-propyl, iso-butyl, sec-butyl, tert-butyl, 2-methyl-pentyl, 2-ethyl-hexyl, cyclopropyl, cyclohexyl, indanyl, norbornyl. Preferably, the alkyl group is a $C_1$ to $C_8$ alkyl group, more preferably a $C_1$ to $C_6$ alkyl group, in particular a $C_1$ to $C_4$ alkyl group. Alkyl groups can be substituted for example by halogens like fluoride, chloride, bromide, iodide; by pseudohalogens like cyanide, cyanate, thiocyanate; by alcohols; by alkoxygroups such as methoxy or ethoxy; or by trialkylsilyl groups such as trimethylsilyl or dimethyl-tert-butylsilyl. A preferred example for a trialkylsilyl-substituted alkyl group is trimethylsilyl methyl.

Aryl groups include aromatic hydrocarbons such as phenyl, naphthalyl, anthrancenyl, phenanthrenyl groups and heteroaromatic groups such as pyrryl, furanyl, thienyl, pyridinyl, quinoyl, benzofuryl, benzothiophenyl, thienothienyl. Several of these groups or combinations of these groups are also possible like biphenyl, thienophenyl or furanylthienyl. Aryl groups can be substituted for example by halogens like fluoride, chloride, bromide, iodide; by pseudohalogens like cyanide, cyanate, thiocyanate; by alcohols; by alkyl chains; by alkoxy chains; or by triakylsilyl-groups. Aromatic hydrocarbons are preferred, phenyl is more preferred.

A trialkylsilyl group can bear the same or different alkyl groups. Preferably, the trialkylsilyl group bears $C_1$ to $C_6$ alkyl groups, more preferably $C_1$ to $C_4$ alkyl groups. Examples for a trialkylsilyl group with the same alkyl groups are trimethylsilyl, triethylsilyl, tri-n-propylsilyl, tri-iso-propylsilyl, tricyclohexylsilyl. Examples for a trialkylsilyl group with different alkyl groups are dimethyl-tert-butylsilyl, dimethylcyclohexylsilyl, methyl-di-iso-propylsilyl.

Preferably, $R^{11}$, $R^{12}$, $R^{13}$, $R^{14}$, $R^{15}$, $R^{16}$, $R^{17}$, $R^{18}$ are independent of each other hydrogen or methyl. More preferably, at least four of $R^{11}$, $R^{12}$, $R^{13}$, $R^{14}$, $R^{15}$, $R^{16}$, $R^{17}$, $R^{18}$ are hydrogen and the remaining substituents are methyl, for example $R^{11}$, $R^{13}$, $R^{16}$, and $R^{18}$ are hydrogen and $R^{12}$, $R^{14}$, $R^{15}$ and $R^{17}$ are methyl or $R^{14}$, $R^{15}$ und $R^{17}$ are methyl and the remaining substituents are hydrogen; even more preferably at least six of $R^{11}$, $R^{12}$, $R^{13}$, $R^{14}$, $R^{15}$, $R^{16}$, $R^{17}$, $R^{18}$ are hydrogen and the remaining substituents are methyl, for example $R^{14}$ and $R^{15}$ are methyl and the remaining substituents are hydrogen or $R^{17}$ und $R^{15}$ are methyl and the remaining substituents are hydrogen or $R^{17}$ and $R^{12}$ are methyl and the remaining substituents are hydrogen or $R^{14}$ is methyl and the remaining substituents are hydrogen or $R^{17}$ is methyl and the remaining substituents are hydrogen. Particularly preferable, $R^{11}$, $R^{12}$, $R^{13}$, $R^{14}$, $R^{15}$, $R^{16}$, $R^{17}$, $R^{18}$ are hydrogen.

Preferably $R^{21}$, $R^{22}$, $R^{23}$, $R^{24}$ are independent of each other alkyl groups. Preferably $R^{21}$, $R^{22}$, $R^{23}$, $R^{24}$ are the same, more preferably $R^{21}$, $R^{22}$, $R^{23}$, $R^{24}$ are the same alkyl group.

It is possible that all $R^{11}$, $R^{12}$, $R^{13}$, $R^{14}$, $R^{15}$, $R^{16}$, $R^{17}$, $R^{18}$, $R^{21}$, $R^{22}$, $R^{23}$, $R^{24}$ are separate or that two or more of them form a ring. For example, $R^{21}$ and $R^{22}$ can form a ring including the phosphor atom or $R^{23}$ and $R^{24}$ can form a ring including the phosphor atom. Furthermore, $R^{13}$ and $R^{15}$ can form a ring including the nitrogen atom. In this case, L preferably assumes the form L'.

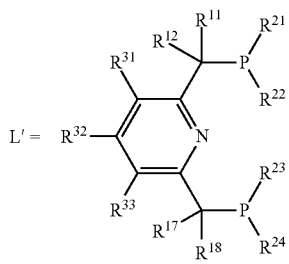

$R^{31}$, $R^{32}$ and $R^{33}$ are independent of each other hydrogen, an alkyl group, an aryl group, or a trialkylsilyl group as described above for $R^{11}$ to $R^{18}$.

Furthermore, it is possible that $R^{11}$ and $R^{12}$ form a ring and/or $R^{17}$ and $R^{18}$ form a ring, for example a cyclopropyl, cyclobutyl, cyclopentyl or cyclohexyl ring. It is further possible that $R^{11}$ and $R^{13}$ form a ring and/or $R^{15}$ and $R^{17}$ form a ring.

It is preferred that the molecular weight of the compound of general formula (I) is up to 1000 g/mol, more preferred up to 800 g/mol, in particular up to 600 g/mol.

The compound of general formula (I) according to the present invention can contain 1 or 2 ligands L, i.e. n is 1 or 2. Preferably, n is 1. If n is 2 the two ligands L can be the same or different to each other, preferably they are the same.

According to the present invention M in the compound of general formula (I) can be any metal or semimetal. Metals include earth alkaline metals such as Be, Mg, Ca, Sr, Ba; main group metals such as Al, Ga, In, Sn, Tl, Pb, Bi; transition metals such as Sc, Ti, V, Cr, Mn, Fe, Co, Ni, Cu, Zn, Y, Zr, Nb, Mo, Tc, Ru, Rh, Pd, Ag, Cd, Hf, Ta, W, Re, Os, Ir, Pt, Au, Hg, Tl, Pb or Bi; lanthanoids such as La, Ce, Pr, Nd, Pm, Sm, Eu, Gd, Tb, Dy, Ho, Er, Tm, Yb, Lu. Semimetals include B, Si, Ge, As, Sb. Transition metals are preferred, in particular Ni or Co.

The metal or semimetal M can be in any oxidation state. Preferably M is close to the oxidation state in which it is supposed to be in the final film on the solid substrate. For example, if a metal or semimetal film of oxidation state 0 is desired, the metal or semimetal M in the compound of general formula (I) should preferably be in the oxidation state 0 or −1 or +1. Another example is a metal oxide film in which the metal shall have the oxidation state +4. In this case, M in the compound of general formula (I) should preferable be in the oxidation state +4 or +3 or +5. More preferably, M in the compound of general formula (I) has the same oxidation state as it is supposed to be in the final film on the solid substrate. In this case no oxidation or reduction is necessary.

According to the present invention the ligand X in the compound of general formula (I) can be any ligand which coordinates M. If X bears a charge, m is normally chosen such that the compound of general formula (I) is neutrally charged. If more than one such ligand is present in the compound of general formula (I), i.e. m>1, they can be the same or different from each other. If m is 3, it is possible that two ligands X are the same and the remaining X is different from these. X can be in any ligand sphere of the metal or semimetal M, e.g. in the inner ligand sphere, in the outer ligand sphere, or only loosely associated to M. It is further possible that if more than one ligands X are present in the compound of general formula (I) the ligands X are in different ligand spheres. Preferably, X is in the inner ligand sphere of M.

The ligand X in the compound of general formula (I) according to the present invention includes anions of halogens like fluoride, chloride, bromide or iodide and pseudohalogens like cyanide, isocyanide, cyanate, isocyanate, thiocyanate, isothiocyanate, or azide. Furthermore, X can be any amine ligand in which the coordinating nitrogen atom is either aliphatic like in dialkylamine, piperidine, morpholine, hexamethyldisilazane; amino imides; or aromatic like in pyrrole, indole, pyridine, or pyrazine. The nitrogen atom of the amine ligand is often deprotonated before coordinated to M. Furthermore, X can be an amide ligand such as formamide or acetamide; an amidinate ligand such as acetamidine; or a guanidinate ligand such guanidine. It is also possible that X is a ligand in which an oxygen atom coordinates to the metal or semimetal. Examples are alkanolates, tetrahydrofurane, acetylacetonate, acetyl acetone, or 1,1,1,5,5,5-pentafluoroacetylacetone. Other suitable examples for X include both a nitrogen and an oxygen atom which both coordinate to M including dimethylamino-iso-propanol. Also suitable for X are ligands which coordinate via a phosphorous atom to M. These include trialkyl phosphines such as trimethyl phosphine, tri-tert-butyl phosphine, tricyclohexyl phosphine, or aromatic phosphines such as triphenyl phosphine, or tritolylphosphine.

Further suitable ligands X are alkyl anions like methyl, ethyl, or butyl anions. Another possible ligand X is hydride. X can also be an unsaturated hydrocarbon which coordinates with the π-bond to M. Unsaturated hydrocarbons include olefins like ethylene, propylene, iso-butylene, cyclohexene, cyclooctene, cyclooctadiene, styrene; and alkynes like ethyne, propyne, 2-butyne. X can also be an unsaturated anionic hydrocarbon which can coordinate both via the anion and the unsaturated bond such as allyl or 2-methylallyl. Cyclopentadiene anions and substituted cyclopentadiene anions are also suitable for X. Another suitable example for X is carbonmonoxide CO or nitric oxide NO. It is particularly preferred that one X is NO and the other X are CO. It is also possible to use molecules which contain multiple atoms which coordinate to M. Examples are bipyridine, o-terpyridine, ethylenediamine, ethylenedi(bisphenylphosphine).

Small ligands which have a low vaporization temperature are preferred for X. Particularly preferred ligands X are carbonmonoxide, cyanide, bromide, methyl, ethylene, cyclooctene or 2-butyne. Small anionic ligands which can easily be transformed into volatile neutral compounds upon protonation, for example by surface-bound protons, are preferred for X. Examples include methyl, ethyl, propyl, dimethylamide, diethylamide, allyl, 2-methyl-allyl.

The compound of general formula (I) used in the process according to the present invention is used at high purity to achieve the best results. High purity means that the substance used contains at least 90 wt.-% compound of general formula (I), preferably at least 95 wt.-% compound of general formula (I), more preferably at least 98 wt.-% compound of general formula (I), in particular at least 99 wt.-% compound of general formula (I). The purity can be determined by elemental analysis according to DIN 51721 (Prüfung fester Brennstoffe—Bestimmung des Gehaltes an Kohlenstoff and Wasserstoff—Verfahren nach Radmacher-Hoverath, August 2001).

In the process according to the present invention the compound of general formula (I) is brought into the gaseous or aerosol state. This can be achieved by heating the compound of general formula (I) to elevated temperatures. In any case a temperature below the decomposition temperature of the compound of general formula (I) has to be chosen. Preferably, the heating temperature ranges from slightly above room temperature to 300° C., more preferably from 30° C. to 250° C., even more preferably from 40° C. to 200° C., in particular from 50° C. to 150° C.

Another way of bringing the compound of general formula (I) into the gaseous or aerosol state is direct liquid injection (DLI) as described for example in US 2009/0 226 612 A1. In this method the compound of general formula (I) is typically dissolved in a solvent and sprayed in a carrier gas or vacuum. Depending on the vapor pressure of the compound of general formula (I), the temperature and the pressure the compound of general formula (I) is either brought into the gaseous state or into the aerosol state. Various solvents can be used provided that the compound of general formula (I) shows sufficient solubility in that solvent such as at least 1 g/l, preferably at least 10 g/l, more preferably at least 100 g/l. Examples for these solvents are coordinating solvents such as tetrahydrofuran, dioxane, diethoxyethane, pyridine or non-coordinating solvents such as hexane, heptane, benzene, toluene, or xylene. Solvent mixtures are also suitable. The aerosol comprising the compound of general formula (I) should contain very fine liquid droplets or solid particles. Preferably, the liquid droplets or solid particles have a weight average diameter of not more than 500 nm, more preferably not more than 100 nm. The weight average diameter of liquid droplets or solid particles can be determined by dynamic light scattering as described in ISO 22412:2008. It is also possible that a part of the compound of general formula (I) is in the gaseous state and the rest is in the aerosol state, for example due to a limited vapor pressure of the compound of general formula (I) leading to partial evaporation of the compound of general formula (I) in the aerosol state.

It is preferred to bring the compound of general formula (I) into the gaseous or aerosol state at decreased pressure. In this way, the process can usually be performed at lower heating temperatures leading to decreased decomposition of the compound of general formula (I). It is also possible to use increased pressure to push the compound of general formula (I) in the gaseous or aerosol state towards the solid substrate. Often, an inert gas, such as nitrogen or argon, is used as carrier gas for this purpose. Preferably, the pressure is 10 bar to $10^{-7}$ mbar, more preferably 1 bar to $10^{-3}$ mbar, in particular 1 to 0.01 mbar, such as 0.1 mbar.

In the process according to the present invention a compound of general formula (I) is deposited on a solid substrate from the gaseous or aerosol state. The solid substrate can be any solid material. These include for example metals, semimetals, oxides, nitrides, and polymers. It is also possible that the substrate is a mixture of different materials. Examples for metals are aluminum, steel, zinc, and copper. Examples for semimetals are silicon, germanium, and gallium arsenide. Examples for oxides are silicon dioxide, titanium dioxide, and zinc oxide. Examples for nitrides are silicon nitride, aluminum nitride, titanium nitride, and gallium nitride. Examples for polymers are polyethylene terephthalate (PET), polyethylene naphthalene-dicarboxylic acid (PEN), and polyamides.

The solid substrate can have any shape. These include sheet plates, films, fibers, particles of various sizes, and substrates with trenches or other indentations. The solid substrate can be of any size. If the solid substrate has a particle shape, the size of particles can range from below 100 nm to several centimeters, preferably from 1 μm to 1 mm. In order to avoid particles or fibers to stick to each other while the compound of general formula (I) is deposited onto them, it is preferably to keep them in motion. This can, for example, be achieved by stirring, by rotating drums, or by fluidized bed techniques.

The deposition takes place if the substrate comes in contact with the compound of general formula (I). Generally, the deposition process can be conducted in two different ways: either the substrate is heated above or below the decomposition temperature of the compound of general formula (I). If the substrate is heated above the decomposition temperature of the compound of general formula (I), the compound of general formula (I) continuously decomposes on the surface of the solid substrate as long as more compound of general formula (I) in the gaseous or aerosol state reaches the surface of the solid substrate. This process is typically called chemical vapor deposition (CVD). Usually, an inorganic layer of homogeneous composition, e.g. the metal or semimetal oxide or nitride, is formed on the solid substrate as the organic material is desorbed from the metal or semimetal M. Typically the solid substrate is heated to a temperature in the range of 300 to 1000° C., preferably in the range of 350 to 600° C.

Alternatively, the substrate is below the decomposition temperature of the compound of general formula (I). Typically, the solid substrate is at a temperature equal to or lower than the temperature of the place where the compound of general formula (I) is brought into the gaseous or aerosol state, often at room temperature or only slightly above. Preferably, the temperature of the substrate is at least 30° C. lower than the place where the compound of general formula (I) is brought into the gaseous or aerosol state. Preferably, the temperature of the substrate is from room temperature to 400° C., more preferably from 100 to 300° C., such as 150 to 220° C.

The deposition of compound of general formula (I) onto the solid substrate is either a physisorption or a chemisorption process. Preferably, the compound of general formula (I) is chemisorbed on the solid substrate. One can determine if the compound of general formula (I) chemisorbs to the solid substrate by exposing a quartz microbalance with a quartz crystal having the surface of the substrate in question to the compound of general formula (I) in the gaseous or aerosol state. The mass increase is recorded by the eigen frequency of the quartz crystal. Upon evacuation of the chamber in which the quartz crystal is placed the mass should not decrease to the initial mass, but about a monolayer of the residual compound of general formula (I) remains if chemisorption has taken place. In most cases where chemisorption of the compound of general formula (I) to the solid substrate occurs, the x-ray photoelectron spectroscopy (XPS) signal (ISO 13424 EN—Surface chemical analysis—X-ray photoelectron spectroscopy—Reporting of results of thin-film analysis; October 2013) of M changes due to the bond formation to the substrate.

If the temperature of the substrate in the process according to the present invention is kept below the decomposition temperature of the compound of general formula (I), typically a monolayer is deposited on the solid substrate. Once a molecule of general formula (I) is deposited on the solid substrate further deposition on top of it usually becomes less likely. Thus, the deposition of the compound of general formula (I) on the solid substrate preferably represents a self-limiting process step. The typical layer thickness of a self-limiting deposition processes step is from 0.01 to 1 nm, preferably from 0.02 to 0.5 nm, more preferably from 0.03 to 0.4 nm, in particular from 0.05 to 0.2 nm. The layer thickness is typically measured by ellipsometry as described in PAS 1022 DE (Referenzverfahren zur Bestimmung von optischen und dielektrischen Materialeigenschaften sowie der Schichtdicke dünner Schichten mittels Ellipsometrie; February 2004).

Often it is desired to build up thicker layers than those just described. In order to achieve this in the process according to the present invention it is preferable to decompose the deposited compound of general formula (I) by removal of all L and X. After this preferably further compound of general formula (I) is deposited. This sequence is preferably performed at least twice, more preferably at least 10 times, in particular at least 50 times. Removing all L and X in the context of the present invention means that at least 95 wt.-% of the total weight of L and X in the deposited compound of general formula (I) are removed, preferably at least 98 wt.-%, in particular at least 99 wt.-%. The decomposition can be effected in various ways. The temperature of the solid substrate can be increased above the decomposition temperature.

Furthermore, it is possible to expose the deposited compound of general formula (I) to a plasma like an oxygen plasma or a hydrogen plasma; to oxidants like oxygen, oxygen radicals, ozone, nitrous oxide ($N_2O$), nitric oxide (NO), nitrogendioxde ($NO_2$) or hydrogenperoxide; to reducing agents like hydrogen, alcohols, hydroazine or hydroxylamine, or solvents like water. It is preferable to use oxidants, plasma or water to obtain a layer of a metal oxide or a semimetal oxide. Exposure to water, an oxygen plasma or ozone is preferred. Exposure to water is particularly preferred. If layers of elemental metal or semimetal are desired it is preferable to use reducing agents. Preferred examples are hydrogen, hydrogen radicals, hydrogen plasma, ammonia, ammonia radicals, ammonia plasma, hydrazine, N,N-dimethylhydrazine, silane, disilane, trisilane, cyclopentasilane, cyclohexasilane, dimethylsilane, diethylsilane, or trisilylamine; more preferably hydrogen, hydrogen radicals, hydrogen plasma, ammonia, ammonia radicals, ammonia plasma, hydrazine, N,N-dimethylhydrazine, silane; in particular hydrogen. The reducing agent can either directly cause the decomposition of the deposited compound of general formula (I) or it can be applied after the decomposition of the deposited compound of general formula (I) by a different agent, for example water. The exposure to a reducing agent is preferred. For layers of metal nitrides it is preferable to use ammonia or hydrazine. Small molecules are believed to easily access the metal or semimetal M due to the planarity of the aromatic part of ligand L which is the consequence of the conjugation of the two iminomethyl groups to the pyrrole unit in ligand L. Typically, a low decomposition time and high purity of the generated film is observed.

A deposition process comprising a self-limiting process step and a subsequent self-limiting reaction is often referred to as atomic layer deposition (ALD). Equivalent expressions are molecular layer deposition (MLD) or atomic layer epitaxy (ALE). Hence, the process according to the present invention is preferably an ALD process. The ALD process is described in detail by George (Chemical Reviews 110 (2010), 111-131).

A particular advantage of the process according to the present invention is that the compound of general formula (I) is very versatile, so the process parameters can be varied in a broad range. Therefore, the process according to the present invention includes both a CVD process as well as an ALD process.

Depending on the number of sequences of the process according to the present invention performed as ALD process, films of various thicknesses are generated. Preferably, the sequence of depositing the compound of general formula (I) onto a solid substrate and decomposing the deposited compound of general formula (I) is performed at least twice. This sequence can be repeated many times, for example 10 to 500, such as 50 or 100 times. Usually, this sequence is not repeated more often than 1000 times. Ideally, the thickness of the film is proportional to the number of sequences performed. However, in practice some deviations from proportionality are observed for the first 30 to 50 sequences. It is assumed that irregularities of the surface structure of the solid substrate cause this non-proportionality.

One sequence of the process according to the present invention can take from milliseconds to several minutes, preferably from 0.1 second to 1 minute, in particular from 1 to 10 seconds. The longer the solid substrate at a temperature below the decomposition temperature of the compound of general formula (I) is exposed to the compound of general formula (I) the more regular films formed with less defects.

The process according to the present invention yields a film. The film can be only one monolayer of deposited compound of formula (I), several consecutively deposited and decomposed layers of the compound of general formula (I), or several different layers wherein at least one layer in the film was generated by using the compound of general formula (I). A film can contain defects like holes. These defects, however, generally constitute less than half of the surface area covered by the film. The film is preferably an inorganic film. In order to generate an inorganic film, all organic ligands L and X have to be removed from the film as described above. More preferably, the film is an elemental metal film. The film can have a thickness of 0.1 nm to 1 μm or above depending on the film formation process as described above. Preferably, the film has a thickness of 0.5 to 50 nm. The film preferably has a very uniform film thickness which means that the film thickness at different places on the substrate varies very little, usually less than 10%, preferably less than 5%. Furthermore, the film is preferably a conformal film on the surface of the substrate. Suitable methods to determine the film thickness and uniformity are XPS or ellipsometry.

The film can be used in electronic elements. Electronic elements can have structural features of various sizes, for example from 100 nm to 100 μm. The process for forming the films for the electronic elements is particularly well suited for very fine structures. Therefore, electronic elements with sizes below 1 μm are preferred. Examples for electronic elements are field-effect transistors (FET), solar cells, light emitting diodes, sensors, or capacitors. In optical devices such as light emitting diodes or light sensors the film according to the present invention serves to increase the reflective index of the layer which reflects light. An example for a sensor is an oxygen sensor, in which a film according to the present invention can serve as oxygen conductor, for example if a metal oxide film is prepared. In field-effect transistors out of metal oxide semiconductor (MOS-FET) the film can act as dielectric layer or as diffusion barrier. It is also possible to make semiconductor layers out of the films in which elemental nickel-silicon is deposited on a solid substrate.

Preferred electronic elements are transistors. The film can act as dielectric, separator of fine structures or as electric contact in a transistor, preferably as electric contact. If the transistor is made of silicon it is possible that after deposition of nickel or cobalt and heating some silicon diffuses into the nickel to form for example NiSi or $CoSi_2$.

EXAMPLES

General Procedures

Thermogravimetric analysis was performed with about 20 mg sample. It was heated by a rate of 5° C./min in an argon stream.

For the differential scanning calorimetry measurements (DSC) a 20 mg sample was placed in a crucible with gas inlet and measured using a Mettler TA 8000. The temperature was increased from 30 to 500° C. at a rate of 2.5 K/min.

All experiments and manipulations were carried out under an atmosphere of argon using standard Schlenk techniques. Prior to use all apparatuses were evacuated and purged with argon for three times. The weighing of all starting materials was done in a nitrogen purged glovebox. Only air- and water-free solvents were used.

The abbreviations in the nuclear magnetic resonance (NMR) spectra have the conventional meaning: s for singlet, d for doublet, t for triplet, q for quartet, ddd for doublet of doublets of doublets, m for multiplet, br for broad.

Example 1

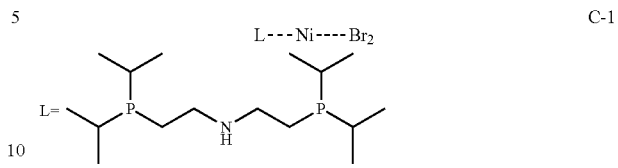

A flask was charged with 3.3 g (10.372 mmol) $NiBr_2 \cdot DME$ (97% purity) and suspended in 50 ml THF. The color of the suspension changed from violet via blue to grey-blue. 30.9 g (10.117 mmol) of a 10% solution of bis(diisopropylphosphinoethyl)amin in THF was transferred to an addition funnel and added to the $NiBr_2 \cdot DME$ suspension within eight minutes at 24-28° C. (slightly exothermic reaction). Upon addition the color of the reaction mixture changed from green to orange-red. The mixture was stirred for 65 hours at room temperature. The resulting orange suspension was evaporated to dryness, the residue was dissolved in 60 ml dichloromethane and filtered over celite. The celite pad was washed three times with 5 ml dichloromethane and once with 10 ml dichloromethane. 200 ml diethyl ether was added to the thus obtained clear orange filtrate whereupon an orange solid crystallized. The solid was collected by filtration, washed four times with 5 ml diethylether and dried. 4.78 g (90.3%) of C-1 were obtained.

$^1$H-NMR ($CD_2Cl_2$, 500 MHz, RT) δ in ppm: 7.1 (s (br), 1H, NH), 3.1 (br, 2H, $NCH_2$), 2.4 (m, 2H, $PCH(CH_3)_2$), 2.2 (m, 6H, $PCH_2$ (2), $NCH_2$ (2), $PCH(CH_3)_2$ (2)), 1.7 (m, 2H, $PCH_2$), 1.6, 1.5, 1.4 and 1.3 (td, 24H, $PCH(CH_3)_2$).

$^{13}$C-NMR ($CD_2Cl_2$, 125 MHz, RT) δ in ppm: 53.61 (t, $NCH_2$), 24.06 (t, $PCH(CH_3)_2$), 23.29 (t, $PCH(CH_3)_2$), 20.4 (t, $PCH_2$), 18.51, 18.26, 17.24 and 16.89 (s, $PCH(CH_3)_2$).

$^{31}$P-NMR ($CD_2Cl_2$, 202 MHz, RT) δ in ppm: 56.89 (s).

LIFDI-MS from $CD_2Cl_2$-solution: m/z=521, calc for M=$[C_{16}H_{37}Br_2NNiP_2]$: 521.012146, m/z=442, calc for $M^+$= $[C_{16}H_{37}BrNNiP_2]^+$: 442.093260.

Figure 1:
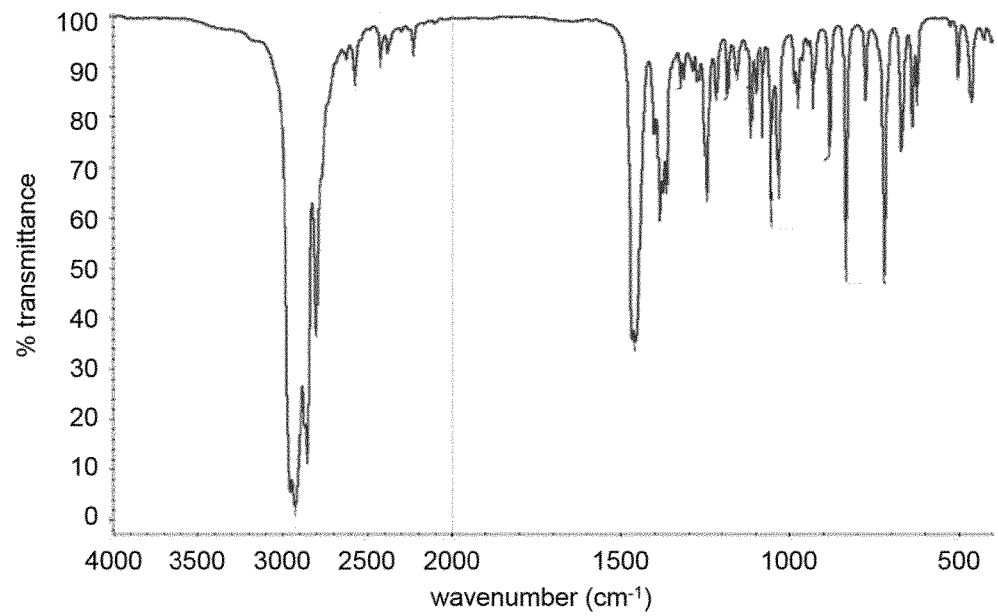
FIGS. 1, 4, 7, 9, 12, 13, 15, and 17 depict infrared (IR) spectra of the compounds C-1, C-6, C-7, C-8, C-9, C-10, C-11, and C-12 respectively.

The IR-spectra of C-1 is depicted in FIG. 1.

Example 2

L---Ni----$CH_3$

C-2

The apparatus was prior to the reaction evacuated and purged with argon for three times. The reaction was run under an argon atmosphere, air- and water-free solvents were used.

The reaction described in example 1 was followed with 9.9 mmol of $NiBr_2 \cdot DME$ and bis(diisopropylphosphinoethyl)amin each. The collected product C-1 was transferred into a flask by dissolving it in 40 ml methanol. The methanol was removed by evaporation. The solid residue was suspended in 150 ml THF, cooled to 0° C. and a mixture of 50 ml THF and 15.5 ml methyllithium (1.6 M in diethylether; 24.8 mmol) was slowly added over the course of 10 minutes. Upon addition gas evolution as well as a dark staining of the reaction mixture was observed. A clear deep red solution was obtained. This solution was stirred for 19 hours. Then, the solvent was removed by evaporation and the residue suspended in 500 ml pentane. The insoluble part was removed by filtration. After letting stand the solution for a while a voluminous white precipitate formed which was removed by filtration. The filtrate was kept for 18 hours at room temperature after which the newly formed precipitate was removed by filtration. The filtrate was evaporated to dryness whereupon an orange solid formed.

$^1$H-NMR (C$_6$D$_6$, 360 MHz, RT) δ in ppm: 3.09 (4H), 1.90 (4H), 1.70 (4H), 1.20 (12H), 1.09 (12H), −0.73 (3H).

$^{13}$C-NMR (C$_6$D$_6$, 90 MHz, RT) δ in ppm: 58.89, 25.25, 23.67, 19.20, 17.82, −26.52.

$^{31}$P-NMR (C$_6$D$_6$, 146 MHz, RT) δ in ppm: 67.62.

Figure 2:
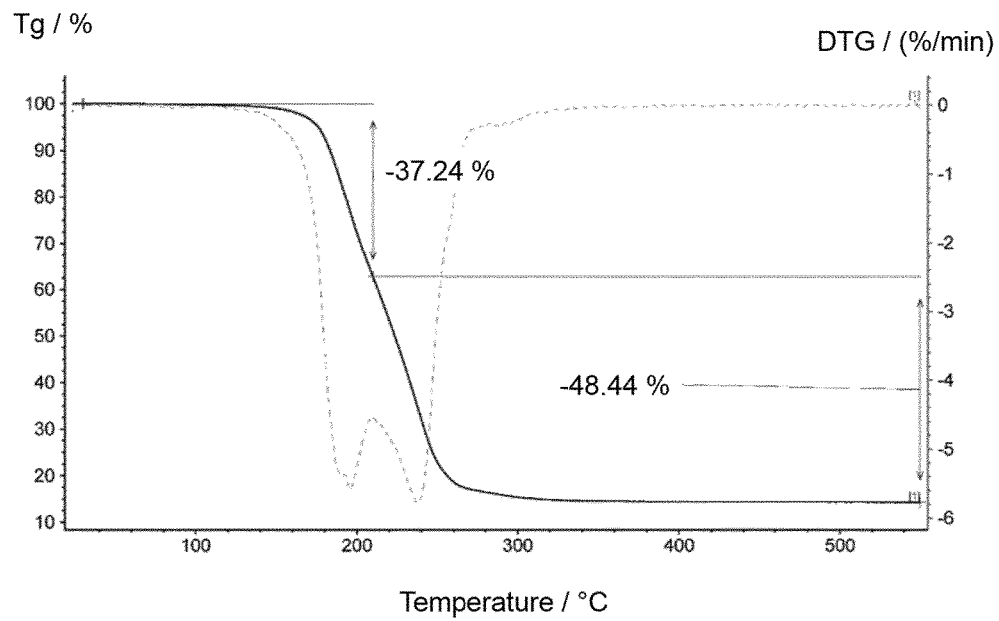
FIGS. 2, 5, 8, 10, 14, 16, 18, and 19 depict thermogravimetric analyses (TGA) of the compounds C-2, C-6, C-7, C-8, C-10, C-11, C-12, and C-13 respectively.

The thermogravimetric analysis of C-2 is depicted in FIG. 2. Deriving from the thermogravimetric analysis, the sample has lost 85.68% of its mass at 550° C.

Figure 3:
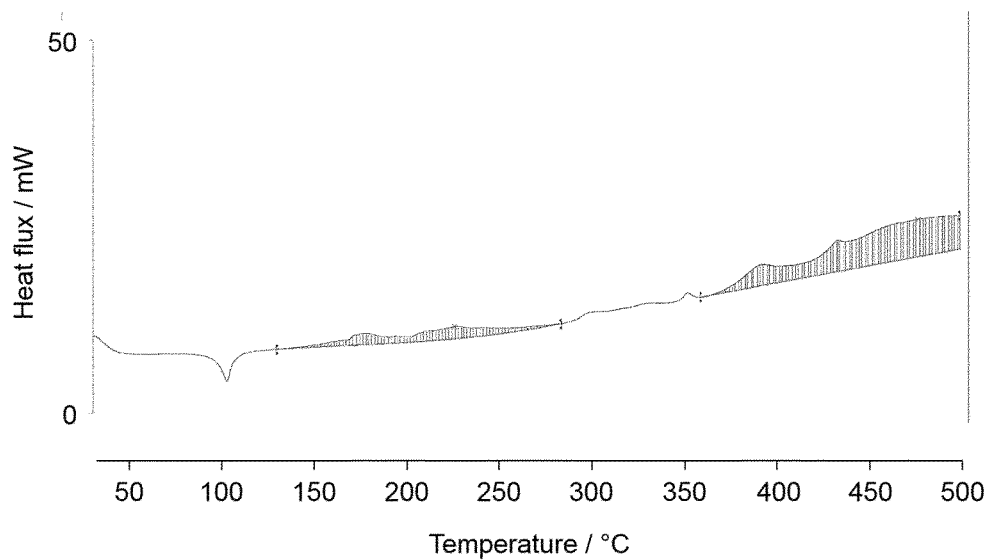
FIG. 3 depicts a differential scanning calorimetry analysis (DSC) of compound C-2.

The differential scanning calorimetry (DSC) of C-2 is depicted in FIG. 3 and shows two exothermic peaks at 140° C. and 365° C.

Example 3

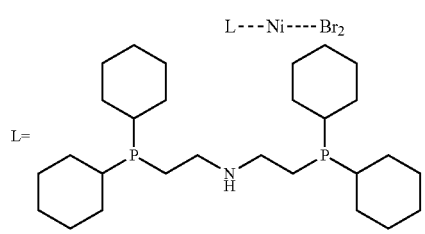

C-3

1.31 g (4.117 mmol) NiBr$_2$.DME (97% purity) were suspended in 25 ml THF. The color of the suspension changed from violet via blue to grey-blue to violet. A solution of 1.98 g (4.124 mmol) bis(dicyclohexylphosphinoethyl)amine (97% purity) in 40 ml THF was added dropwise to the NiBr$_2$.DME suspension at room temperature. The color of the suspension changed via blue to orange-red. The mixture was stirred for 66 hours at room temperature. The resulting orange suspension was evaporated to dryness, the residue was dissolved in 80 ml dichloromethane and filtered over celite. The celite pad was washed four times with 10 ml dichloromethane. 250 ml diethyl ether were added to the thus obtained clear orange filtrate whereupon an orange solid crystallized. The solid was collected by filtration, washed two times with 10 ml diethylether and dried. 1.78 g (63.2%) of C-3 were obtained.

$^1$H-NMR (CD$_2$Cl$_2$, 500 MHz, RT) δ in ppm: 6.77 (s), 3.35 (q), 3.25 (s), 2.35 (m), 2.30 (m), 2.15 (m), 1.95 (m), 1.80 (m), 1.65 (m), 1.28 (m), 1.05 (t).

$^{13}$C{$^1$H}-NMR (CD$_2$Cl$_2$, 125 MHz, RT) δ in ppm: 53.55 (t), 33.40 (t), 32.62 (t), 28.65 (s), 28.53 (s), 28.26 (s), 27.57 (s), 26.42 (t), 26.30 (t), 26.13 (t), 25.94 (t), 25.32 (s), 25.25 (s) 21.24 (t).

$^{31}$P{$^1$H}-NMR (CD$_2$Cl$_2$, 202 MHz, RT) δ in ppm: 48.23 (s).

LIFDI-MS from CD$_2$Cl$_2$-solution: m/z=602, calc for M$^+$= [C$_{28}$H$_{53}$BrNNiP$_2$]$^+$: 602.2185; m/z=681, calc for M=[C$_{28}$H$_{53}$Br$_2$NNiP2]: 681.1373.

Example 4

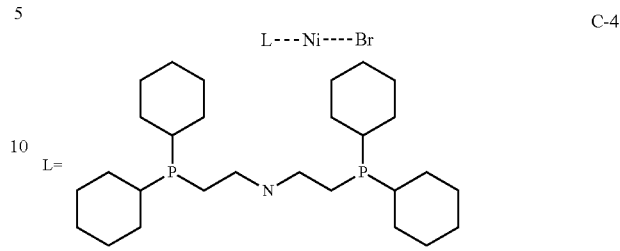

C-4

1.07 g (1.564 mmol) of the product C-3 and 169 mg (3.128 mmol) sodium methylat was transferred into a flask and suspended in 50 ml THF. The reaction mixture was stirred at room temperature for 15 minutes before it was heated to 50° C. for 10 minutes. A color change from orange to green was observed upon heating. The reaction mixture was slowly cooled down to room temperature and stirred for another 16 hours. The resulting green suspension was evaporated to dryness and the residue was suspended in 25 ml n-pentane. The solid was separated by filtration and washed three times with 5 ml n-pentane. Evaporation of the green filtrate to dryness gave C-4 as a green solid.

$^1$H-NMR (C$_6$D$_6$, 500 MHz, RT) δ in ppm: 2.65 (t), 2.1 (s), 1.9-1.5 (m), 1.3-1.0 (m).

$^{13}$C{$^1$H}-NMR (C$_6$D$_6$, 125 MHz, RT) δ in ppm: 61.6 (t), 34.0 (t), 29.6 (s), 28.8 (s), 27.8 (t), 27.6 (t), 27.0 (s), 23.7 (s).

$^{31}$P{$^1$H}-NMR (C$_6$D$_6$, 202 MHz, RT) δ in ppm: 58.24 (s).

LIFDI-MS from C$_6$D$_6$-solution: m/z=601, calc for M=[C$_{28}$H$_{52}$BrNNiP$_2$]: 601.211184.

Example 5

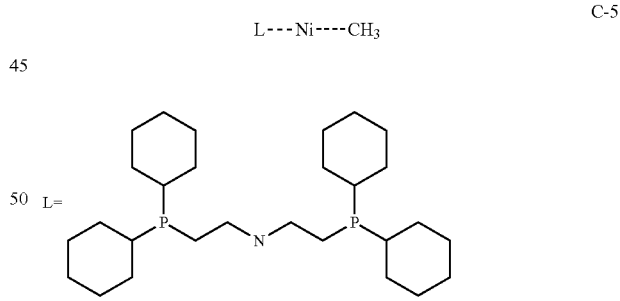

C-5

At room temperature 0.37 ml methyllithium (1.6 M in diethylether; 0.592 mmol) were slowly added to a solution of 326.7 mg (0.5415 mmol) of the product C-4 dissolved in 40 ml THF. The reaction mixture was stirred for 90 hours before it was refluxed for 24 hours. After addition of another 0.74 ml methyllithium (1.6 M in diethylether; 1.184 mmol) the reaction mixture was stirred for 4 hours at room temperature and a color change to orange-brown was observed. The reaction mixture was evaporated to dryness to give C-5 as orange, solid residue.

$^{31}$P-NMR (THF, 202 MHz, RT) δ in ppm: 60.15 (s).

Example 6

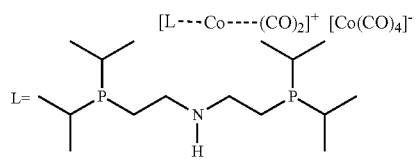

C-6

1.975 g (5.198 mmol) Co$_2$(CO)$_8$ (90% purity) were dissolved in 50 ml THF at 0-5° C. A solution of 3.72 g (11.55 mmol) bis(diisopropylphosphinoethyl)amine (94.9% purity) dissolved in 50 ml THF was slowly added over the course of 15 minutes at −25° C. The reaction mixture was allowed to warm up to room temperature and was stirred for 18 hours. The resulting orange solution was evaporated to dryness and the red residue was dissolved in 15 ml methanol. After slow addition of 60 ml n-pentane an orange suspension was formed. The solid was separated by filtration, washed two times with 15 ml n-pentane and dried to give 2.32 g (67.9%) of C-6 as an orange solid.

$^1$H-NMR (C$_6$D$_6$, 500 MHz, RT) δ in ppm: 3.65 (s (br), 1H), 3.2 (m (br), 2H), 1.8 (m (br), 2H), 1.55 (m (br), 4H), 1.45 (m, 4H), 0.85 (m, 6H), 0.6 (m, 12H), 0.5 (m, 6H).

$^{13}$C{$^1$H}-NMR (C$_6$D$_6$, 125 MHz, RT) δ in ppm: 199.66, 196.53, 53.28, 25.63, 24.91, 23.87, 16.83, 15.97.

$^{31}$P{$^1$H}-NMR (C$_6$D$_6$, 202 MHz, RT) δ in ppm: 95.35 (s).

LIFDI-MS from C$_6$D$_6$-solution: m/z=420, calc for M$^+$= [C$_{18}$H$_{37}$CoNO$_2$P$_2$]$^+$: 420.1626.

ESI, negative from acetonitrile-solution: m/z=171, calc for M$^-$=[C$_4$O$_4$Co]$^-$: 170.97.

Figure 4:
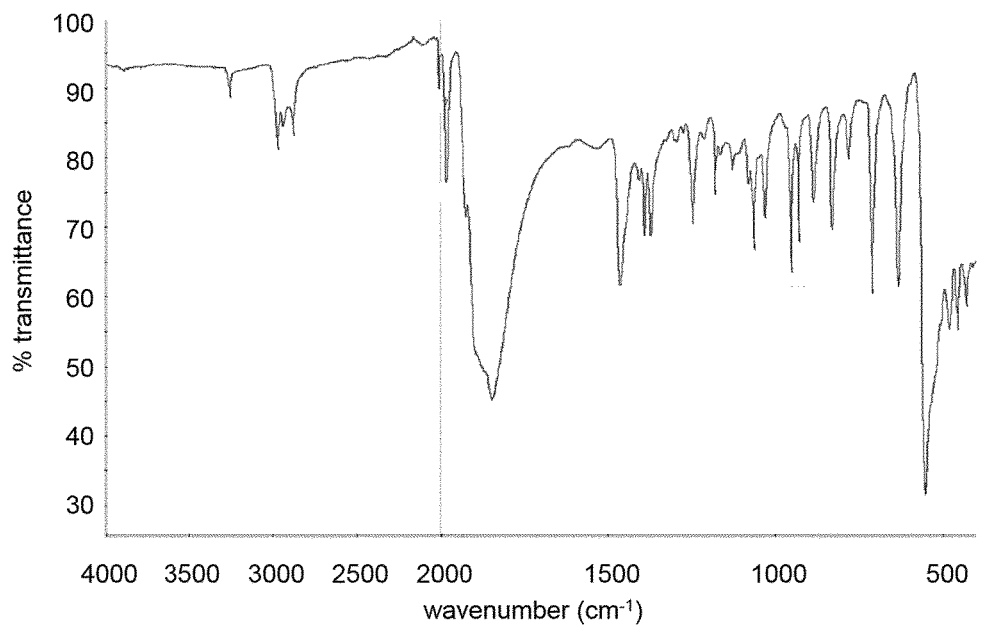

The IR-spectra of C-6 is depicted in FIG. 4.

Figure 5:
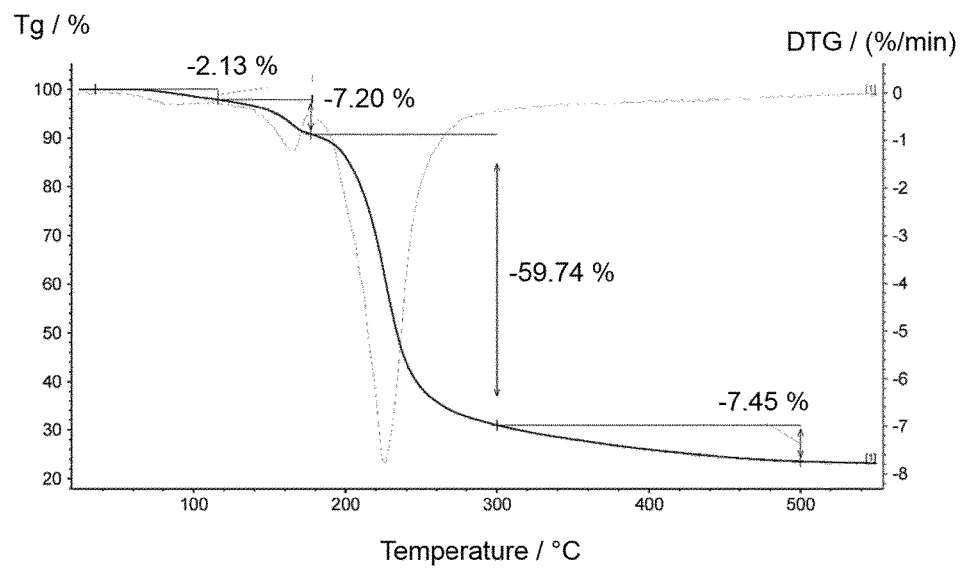

The thermogravimetric analysis of C-6 is depicted in FIG. 5. Deriving from the thermogravimetric analysis, the sample has lost 76.52% of its mass at 500° C.

Figure 6:
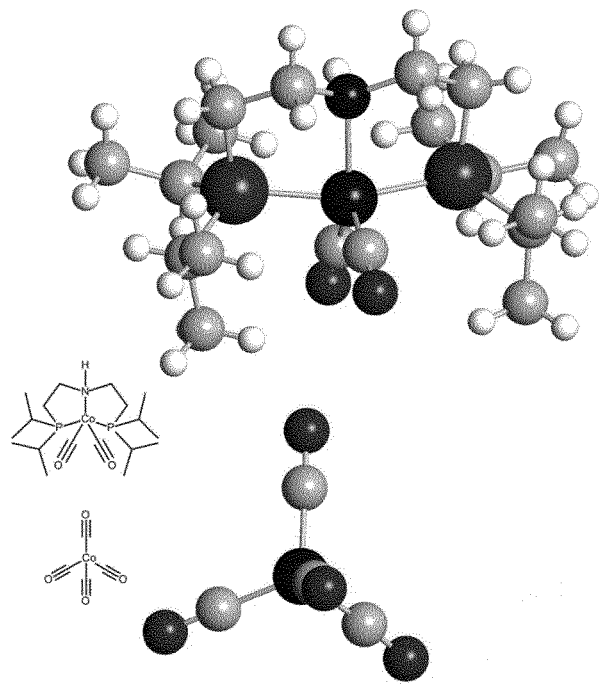
FIGS. 6 and 11 depict the crystal structures of the compounds C-6 and C-8 respectively.

Crystals suitable for X-ray diffraction were obtained by storing the filtrate at 0.4° C. The crystal structure was measured by standard techniques and is shown in FIG. 6.

Example 7

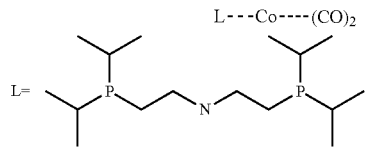

C-7

Thermal cleavage of 1.99 g (3.37 mmol) of the product C-6 at 60-100° C. and 1.1·10$^{-2}$ mbar yield 0.63 g (1.5 mmol) of the neutral compound C-7 as an orange solid (44.5%). C-7 can be further purified by sublimation at 2.7·10$^{-2}$ mbar and 90° C.

$^1$H-NMR (C$_6$D$_6$, 500 MHz, RT) δ in ppm: 2.95 (m, 2H), 1.8 (m, 2H), 1.5 (m, 2H), 1.05 (q, 6H), 0.75 (q, 6H).

$^{13}$C{$^1$H}-NMR (C$_6$D$_6$, 125 MHz, RT) δ in ppm: 206.55, 59.43, 24.32, 23.28, 17.97, 16.62.

$^{31}$P{$^1$H}-NMR (C$_6$D$_6$, 202 MHz, RT) δ in ppm: 102.22 (s (br)).

Figure 7:
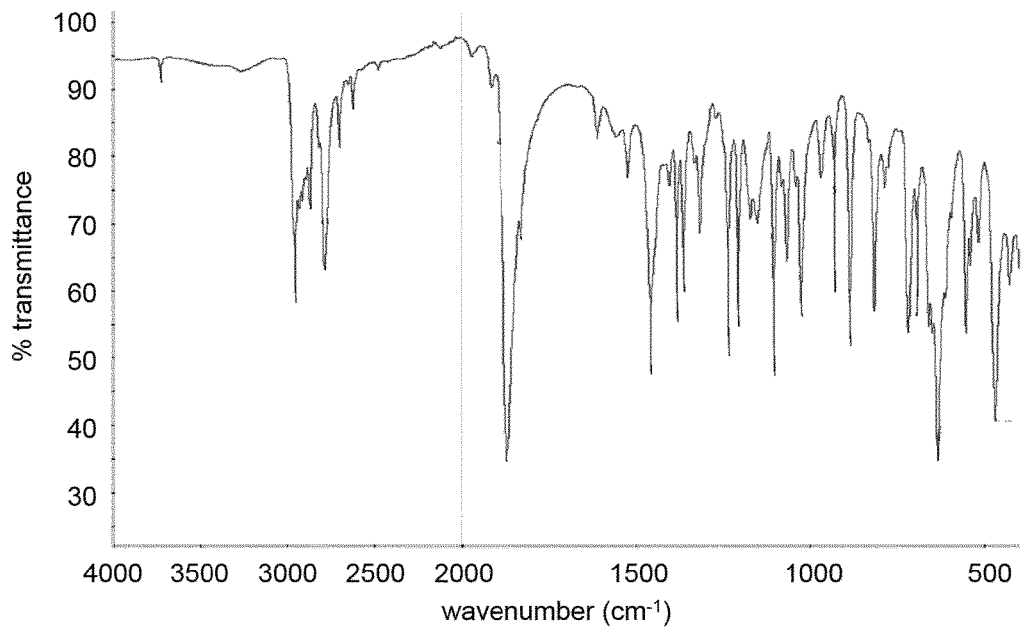

The IR-spectra of C-7 is depicted in FIG. 7.

Figure 8:
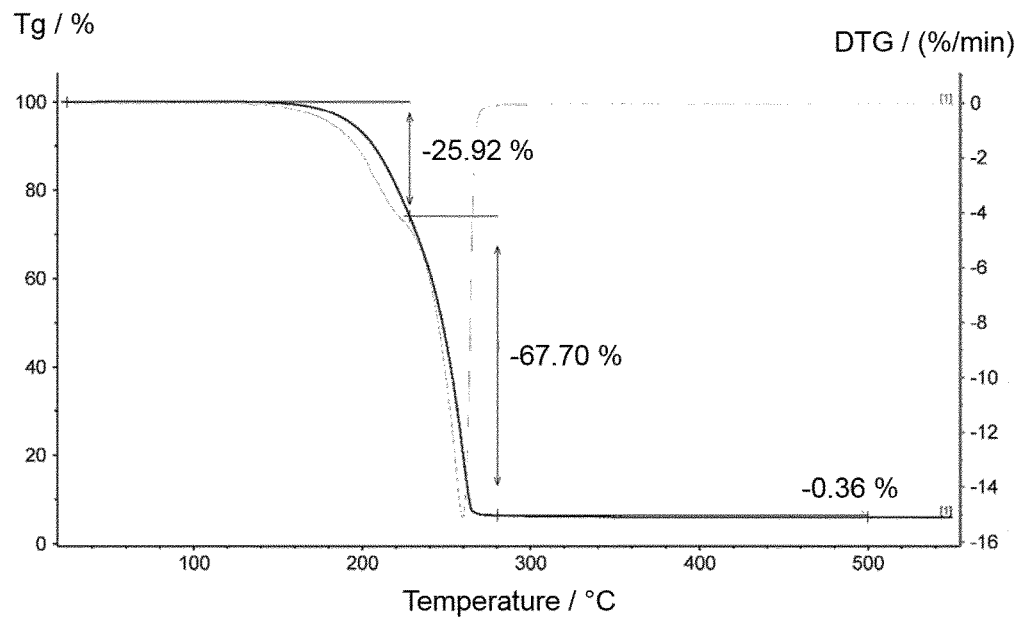

The thermogravimetric analysis of C-7 is depicted in FIG. 8. Deriving from the thermogravimetric analysis, the sample has lost 93.98% of its mass at 500° C.

Example 8

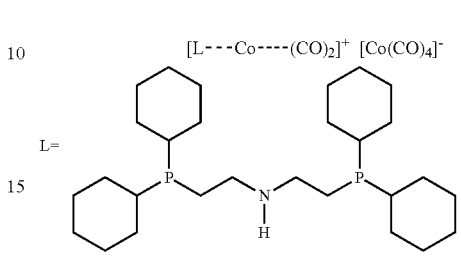

C-8

At room temperature a solution of 1.993 g (4.152 mmol) bis(dicyclohexylphosphinoethyl)amine (97% purity) dissolved in 25 ml THF was added dropwise over the course of 5 minutes to a solution of 0.79 g (2.076 mmol) Co$_2$(CO)$_8$ (90% purity) dissolved in 25 ml THF. The reaction mixture was diluted by further addition of 20 ml THF and stirred for 16 hours at room temperature. The resulting orange solution was evaporated to dryness and the orange residue was dissolved in 50 ml methanol to obtain an orange suspension. The solid was separated by filtration, washed two times with 10 ml n-pentane and dried to give C-8 as an orange solid.

$^1$H-NMR (CD$_2$Cl$_2$, 500 MHz, RT) δ in ppm: 3.75 (s (br), 1H), 3.40 (s (br), 2H), 2.1 (m(br)), 1.84 (m (br)), 1.70 (m (br)), 1.28 (s(br)).

$^{13}$C{$^1$H}-NMR (CD$_2$Cl$_2$, 125 MHz, RT) δ in ppm: 55.07, 37.41, 36.86, 29.16, 28.41, 28.26, 27.37, 27.21, 26.40, 26.36, 25.29.

$^{31}$P{$^1$H}-NMR (CD$_2$Cl$_2$, 202 MHz, RT) δ in ppm: 85.62 (s).

LIFDI-MS from THF-solution: m/z=580, calc for M$^+$= [C$_{30}$H$_{53}$CoNO$_2$P$_2$]$^+$: 580.288353.

Figure 9:
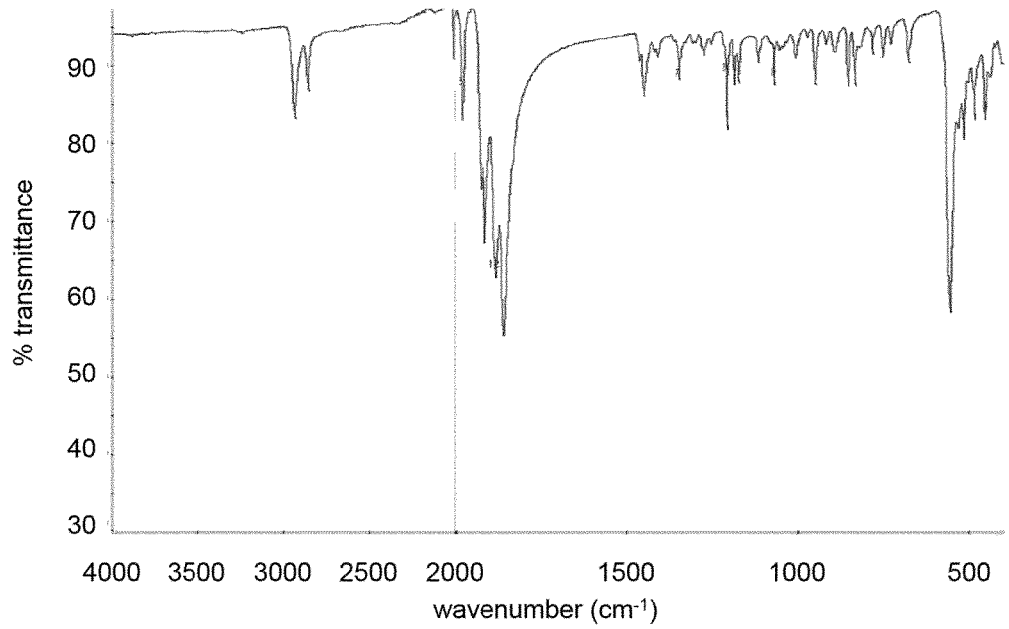

The IR-spectra of C-8 is depicted in FIG. 9.

Figure 10:
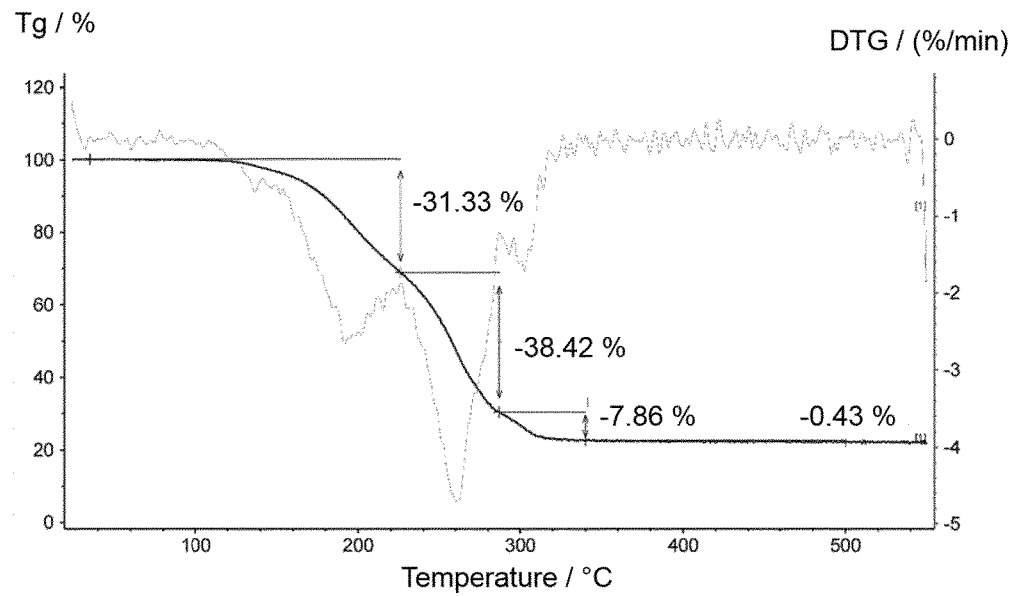

The thermogravimetric analysis of C-8 is depicted in FIG. 10. Deriving from the thermogravimetric analysis, the sample has lost 78.04% of its mass at 500° C.

Figure 11:
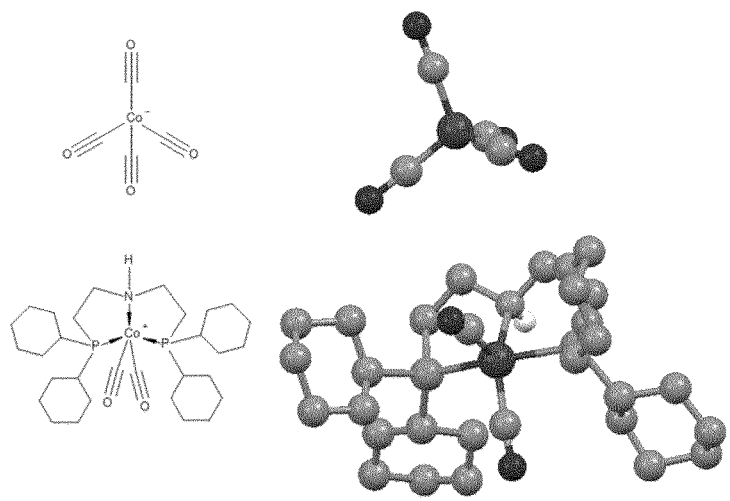

Crystals suitable for X-ray diffraction were obtained by storing the filtrate at 0.4° C. The crystal structure was measured by standard techniques and is shown in FIG. 11.

Example 9

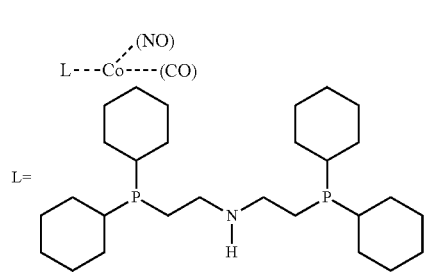

C-9

At room temperature a solution of 0.99 g (2.05 mmol) bis(dicyclohexylphosphinoethyl)amine (97% purity) dissolved in 20 ml THF was added dropwise over the course of 5 minutes to a solution of 355 mg (2.05 mmol) Co(CO)$_3$ (NO) dissolved in 15 ml THF. The reaction mixture was stirred for 18 hours at room temperature before the resulting orange solution was evaporated to dryness. The orange residue was suspended in 24 ml methanol. The solid was separated by filtration and dried to give C-9 as a beige solid $^1$H-NMR (C$_6$D$_6$, 500 MHz, RT) δ in ppm: 3.28 (t), 2.24 (m (br)), 2.05 (m (br)), 1.88 (d (br)), 1.68 (d (br)), 1.6-1.05 (m (br)), 1.05-0.85 (m (br)).

$^{13}$C{$^1$H}-NMR (C$_6$D$_6$, 125 MHz, RT) δ in ppm: 41.92, 36.92, 28.30, 27.89, 27.08, 26.99, 26.69, 26.66, 26.61, 26.59, 26.40, 26.31, 25.38, 20.79.

$^{31}$P{$^1$H}-NMR (C$_6$D$_6$, 202 MHz, RT) δ in ppm: 49.56 (s).

Figure 12:
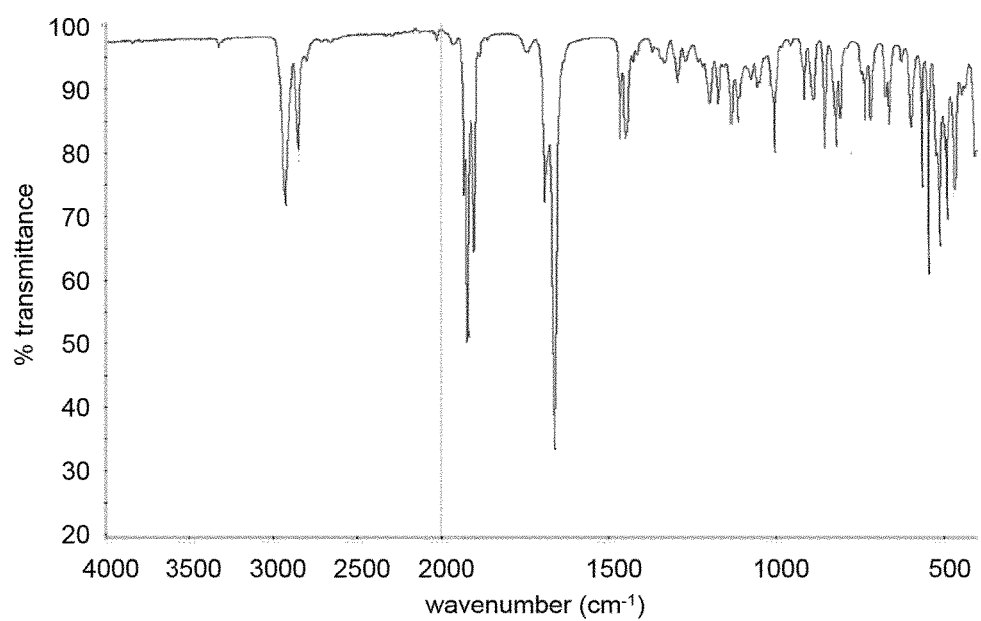

The IR-spectra of C-9 is depicted in FIG. 12.

Example 10

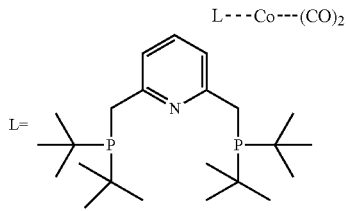

C-10

At −30° C. a solution of 2.22 g (5.56 mmol) 2,6-Bis(di-tert.butylphosphinomethyl)pyridine (99% purity) dissolved in 25 ml THF was added dropwise over the course of 5 minutes to a solution of 1.06 g (2.78 mmol) Co$_2$(CO)$_8$ (90% purity) dissolved in 25 ml THF. The reaction mixture was slowly warmed to room temperature and stirred for 22 hours. Evaporation of the reaction mixture to dryness gave a dark red residue which was suspended in 50 ml methanol. The solid was separated by filtration and dried to give C-10 as a dark red solid $^1$H-NMR (CD$_2$Cl$_2$, 500 MHz, RT) δ in ppm: 7.8 (s, 1H, CH), 7.45 (s, 2H, CH), 3.65 (s, 4H, PCH$_2$), 1.35 (s, 36H, C(CH$_3$)$_3$).

$^{13}$C{$^1$H}-NMR (CD$_2$Cl$_2$, 125 MHz, RT) δ in ppm: 164.65, 140.57, 121.06, 35.3, 33.99, 28.38.

$^{31}$P{$^1$H}-NMR (CD$_2$Cl$_2$, 202 MHz, RT) δ in ppm: 85.57 (s).

Figure 13:
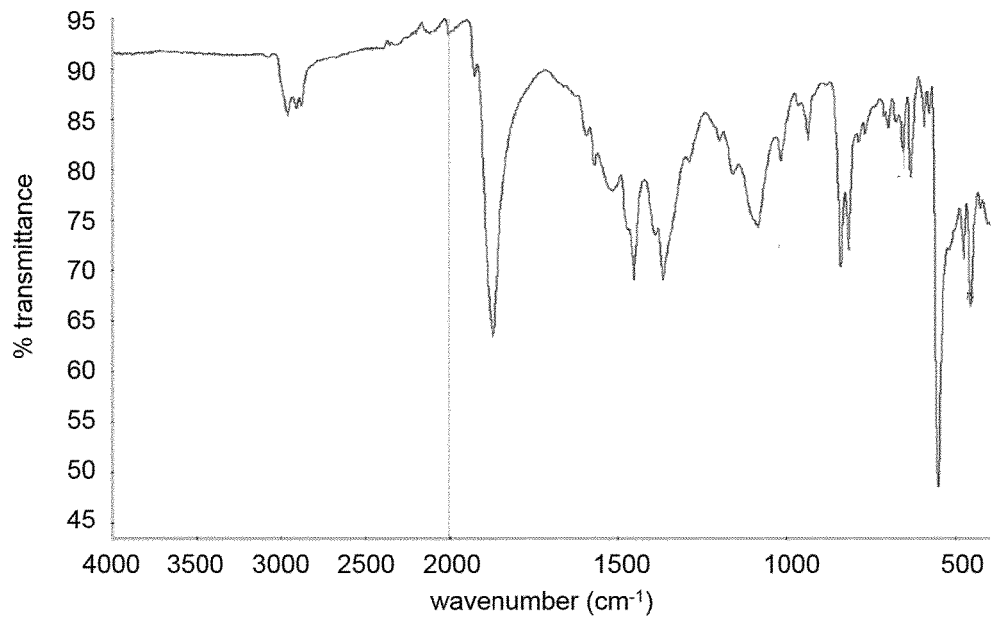

The IR-spectra of C-10 is depicted in FIG. 13.

Figure 14:
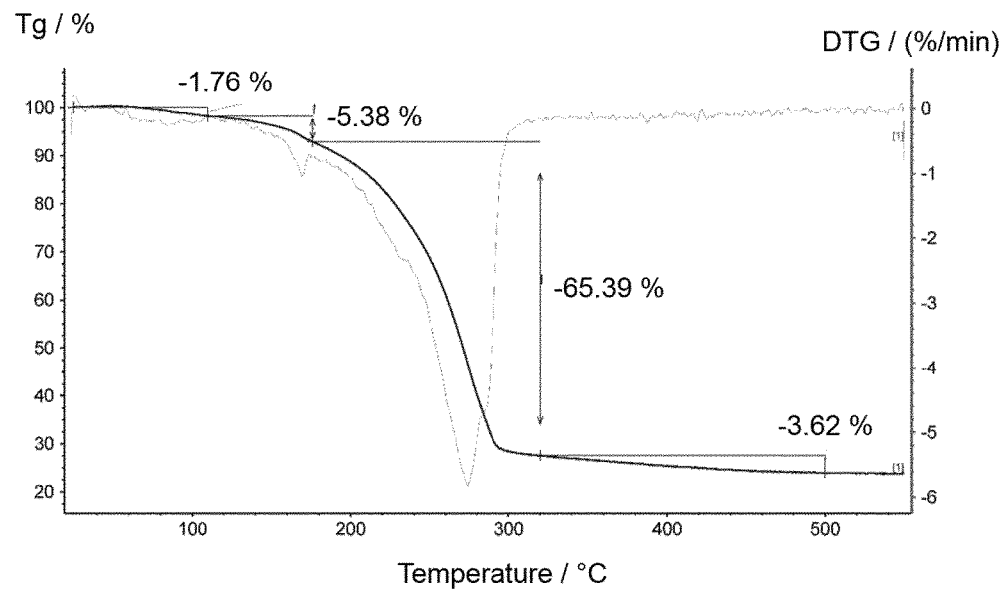

The thermogravimetric analysis of C-10 is depicted in FIG. 14. Deriving from the thermogravimetric analysis, the sample has lost 76.15% of its mass at 500° C.

Example 11

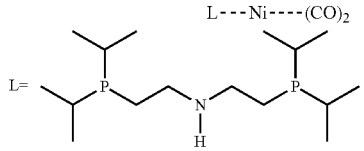

C-11

At 0° C. a flask was charged with 0.28 g (1.64 mmol) Ni(CO)$_4$. 10 ml toluene were added at 0° C. as solvent before 0.5 g (1.64 mmol) bis(diisopropylphosphinoethyl) amine (94.9% purity) were slowly added to the reaction mixture. The reaction mixture was stirred 1 hour at 0° C. and slowly warmed up to room temperature. Upon stirring for 18 hours at room temperature the colorless reaction mixture turned green. After evaporation of the reaction mixture to dryness a green solid was obtained, which was re-dissolved in 10 ml pentane and evaporated to dryness for three times. 0.47 g (72.7%) C-11 were obtained a green solid.

$^1$H-NMR (C$_6$D$_6$, 500 MHz, RT) δ in ppm: 2.95 (s (br), 1H, NH), 2.54 (m, 2H, NCH$_2$), 1.74 (m, 2H, PCH$_2$), 1.32 (q, 2H, PCH), 1.08 (ddd, 12H, PCH(CH$_3$)$_2$).

$^{13}$C{$^1$H}-NMR (C$_6$D$_6$, 125 MHz, RT) δ in ppm: 202.41 (s, CO), 43.13 (s, NCH$_2$), 25.91 (m, PCH), 22.86 (m, PCH$_2$), 15.58 (t, PCH(CH$_3$)), 18.11 (t, PCH(CH$_3$)).

$^{31}$P{$^1$H}-NMR (C$_6$D$_6$, 202 MHz, RT) δ in ppm: 34.81 (s).

LIFDI-MS from C$_6$D$_6$-solution: m/z=391, calc for M$^+$= [C$_{17}$H$_{37}$NNiOP$_2$]$^+$: 391.17038.

Figure 15:
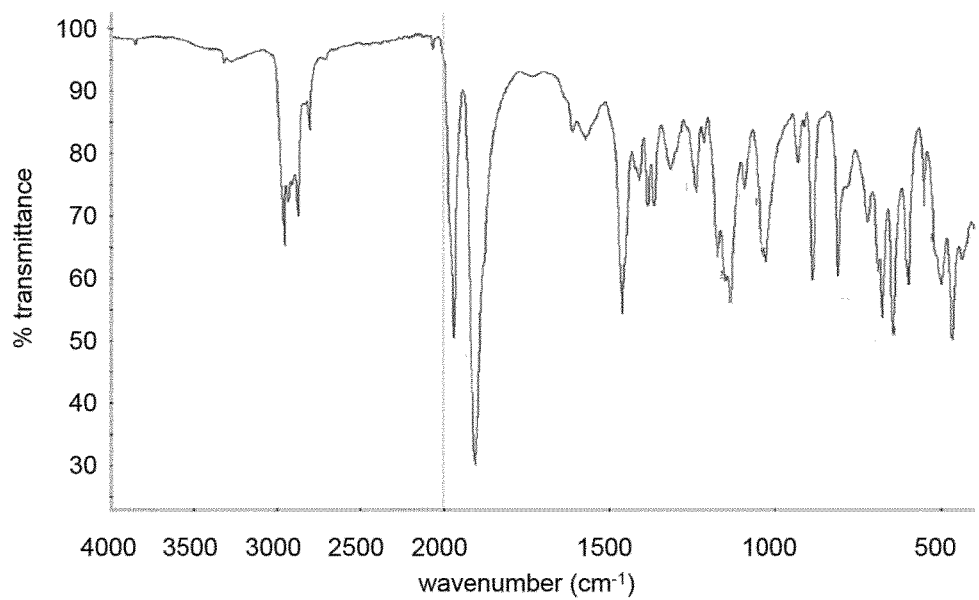

The IR-spectra of C-11 is depicted in FIG. 15.

Figure 16:
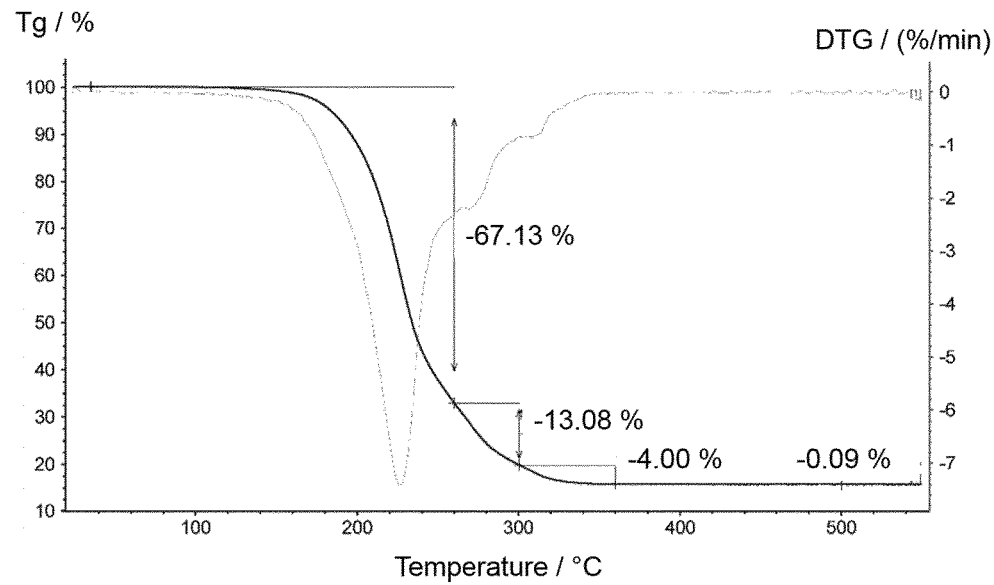

The thermogravimetric analysis of C-11 is depicted in FIG. 16. Deriving from the thermogravimetric analysis, the sample has lost 84.3% of its mass at 500° C.

Example 12

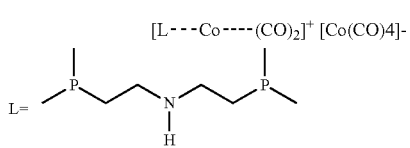

C-12

At room temperature a solution of 0.91 g (4.49 mmol) bis(dimethylphosphinoethyl)amine (95% purity) dissolved in 20 ml in THF was added slowly over the course of 5 minutes to a solution of 1.7 g (4.47 mmol) Co$_2$(CO)$_8$ (90% purity) dissolved in 50 ml THF. The reaction mixture was stirred for 18 hours at room temperature before it was heated to reflux for 5 days. The resulting orange solution was evaporated to dryness to obtain C-12 as a dark green solid.

$^1$H-NMR (CD$_2$Cl$_2$, 500 MHz, RT) δ in ppm: 3.5, 3.0, 2.4, 1.9, 1.5 (all very broad).

$^{13}$C{$^1$H}-NMR (CD$_2$Cl$_2$, 125 MHz, RT) δ in ppm: 74.92, 70.53, 35.20, 25.20, 17.75.

$^{31}$P{$^1$H}-NMR (CD$_2$Cl$_2$, 202 MHz, RT) δ in ppm: 48.75 (s).

Figure 17:
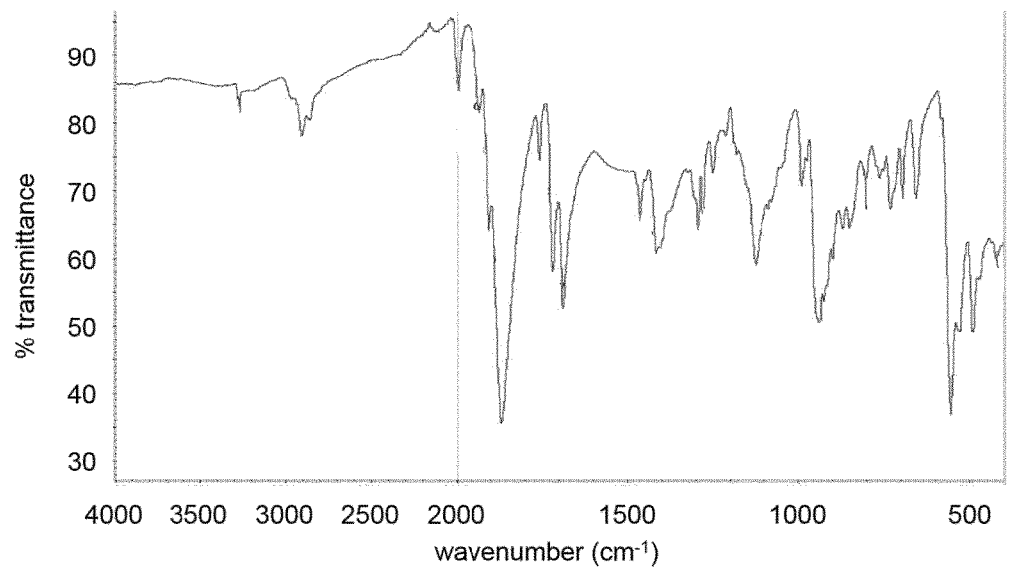

The IR-spectra of C-12 is depicted in FIG. 17.

Figure 18:
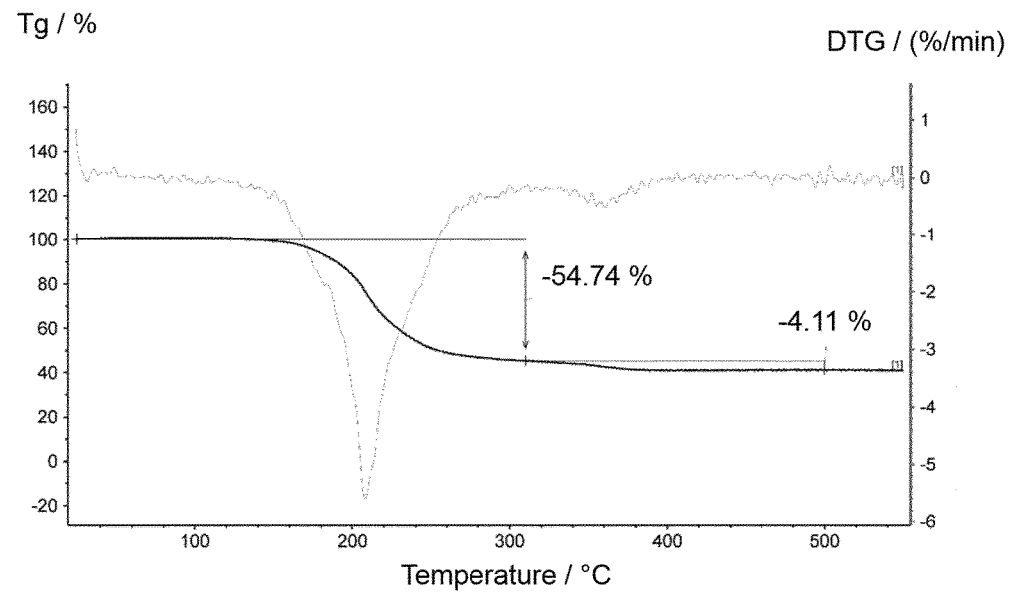

The thermogravimetric analysis of C-12 is depicted in FIG. 18. Deriving from the thermogravimetric analysis, the sample has lost 58.85% of its mass at 500° C.

Example 13

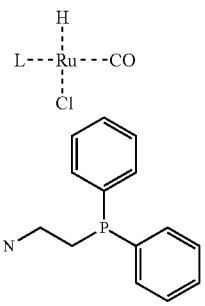

C-13

C-13 was purchased from Sigma Aldrich.

$^{31}$P{$^1$H}-NMR (THF-d$^8$, 202 MHz, RT) δ in ppm: 52.92 (d).

Figure 19:
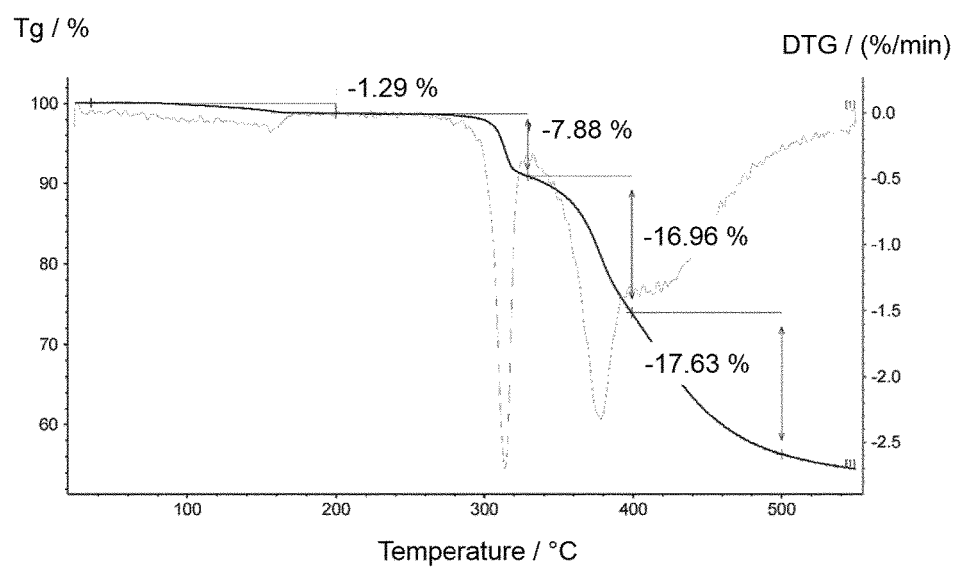

The thermogravimetric analysis of C-13 is depicted in FIG. 19. Deriving from the thermogravimetric analysis, the sample has lost 43.76% of its mass at 500° C.

The invention claimed is:

1. A process, comprising bringing a compound of formula (I) into the gaseous or aerosol state and depositing the compound of formula (I) from the gaseous or aerosol state onto a solid substrate:

$$L_n\text{---}M\text{---}X_m \quad (I)$$

wherein:

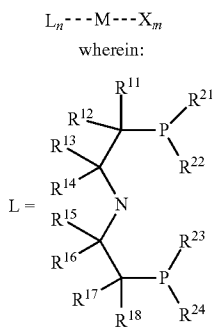

$R^{11}$, $R^{12}$, $R^{13}$, $R^{14}$, $R^{15}$, $R^{16}$, $R^{17}$, $R^{18}$ are independent of each other hydrogen, an alkyl group, an aryl group, or a trialkylsilyl group, $R^{21}$, $R^{22}$, $R^{23}$, $R^{24}$ are independent of each other an alkyl group, an aryl group, or a trialkylsilyl group, n is 1 or 2, M is a metal or semimetal, X is a ligand which coordinates M, and m is an integer from 0 to 3, wherein the deposited compound of formula (I) is decomposed by removal of all ligands L and X.

2. The process according to claim 1, wherein the compound of formula (I) is chemisorbed on the surface of the solid substrate.

3. The process according to claim 1, wherein the deposited compound of formula (I) is exposed to a reducing agent.

4. The process according to claim 1, wherein the sequence of depositing the compound of formula (I) onto a solid substrate and decomposing the deposited compound of formula (I) is performed at least twice.

5. The process according to claim 4, wherein one sequence of the process takes from 0.1 second to 1 minute.

6. The process according to claim 1, wherein the temperature of the solid substrate is from 100 to 300° C.

7. The process according to claim 1, wherein the compound of formula (I) is mixed with an inert gas before being deposited onto the solid substrate.

8. The process according to claim 1, wherein the pressure at deposition is 1 to 0.01 mbar.

9. The process according to claim 1, wherein M is Ni or Co.

10. The process according to claim 1, wherein $R^{11}$, $R^{12}$, $R^{13}$, $R^{14}$, $R^{15}$, $R^{16}$, $R^{17}$, and $R^{18}$ are hydrogen.

11. The process according to claim 1, wherein $R^{21}$, $R^{22}$, $R^{23}$, and $R^{24}$ are independent of each other alkyl groups.

12. A process of film formation, the process comprising depositing the compound of formula (I) onto the solid substrate as a film:

$$L_n\text{---}M\text{---}X_m \quad (I)$$

wherein:

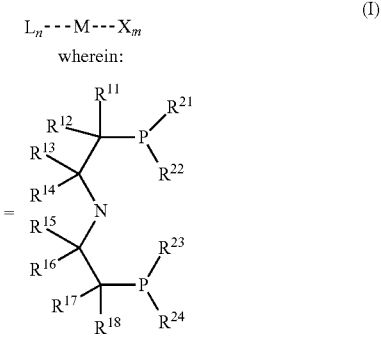

$R^{11}$, $R^{12}$, $R^{13}$, $R^{14}$, $R^{15}$, $R^{16}$, $R^{17}$, $R^{18}$ are independent of each other hydrogen, an alkyl group, an aryl group, or a trialkylsilyl group, $R^{21}$, $R^{22}$, $R^{23}$, $R^{24}$ are independent of each other an alkyl group, an aryl group, or a trialkylsilyl group, n is 1 or 2, M is a metal or semimetal, X is a ligand which coordinates M, and m is an integer from 0 to 3, wherein the deposited compound of formula (I) is decomposed by removal of all ligands L and X.

* * * * *

UNITED STATES PATENT AND TRADEMARK OFFICE
CERTIFICATE OF CORRECTION

PATENT NO. : 10,106,888 B2
APPLICATION NO. : 15/501631
DATED : October 23, 2018
INVENTOR(S) : Julia Strautmann et al.

Page 1 of 1

It is certified that error appears in the above-identified patent and that said Letters Patent is hereby corrected as shown below:

In the Specification

In Column 2, Line 40, delete "alkoxygroups" and insert -- alkoxy groups --;
Line 46, delete "anthrancenyl," and insert -- anthracenyl, --.

In Column 16, Lines 24-29, delete "[Co(CO)4]-" and insert -- [Co(CO)$_4$]- --.

Signed and Sealed this
Twenty-sixth Day of November, 2019

Andrei Iancu
*Director of the United States Patent and Trademark Office*